United States Patent [19]

Kobaru

[11] Patent Number: 5,647,740
[45] Date of Patent: Jul. 15, 1997

[54] LEAD FRAME BAKING OVEN

[75] Inventor: Tetsuya Kobaru, Tokyo, Japan

[73] Assignee: Kabushiki Kaisha Shinkawa, Tokyo, Japan

[21] Appl. No.: 335,045

[22] Filed: Nov. 7, 1994

[30] Foreign Application Priority Data

Nov. 8, 1993 [JP] Japan .................................. 5-300779

[51] Int. Cl.[6] .................................. F27B 9/14; F27B 9/24
[52] U.S. Cl. .................................. 432/122; 432/121; 432/241
[58] Field of Search .................................. 432/5, 6, 121, 432/122, 123, 124, 239, 241

[56] References Cited

U.S. PATENT DOCUMENTS

| | | | |
|---|---|---|---|
| 4,634,329 | 1/1987 | Diederen et al. | 432/122 |
| 4,955,775 | 9/1990 | Ohkase et al. | 432/239 |
| 4,997,364 | 3/1991 | McGrath et al. | 432/122 |
| 5,163,832 | 11/1992 | Ishii et al. | 432/239 |
| 5,360,336 | 11/1994 | Monoe | 432/5 |

FOREIGN PATENT DOCUMENTS

| | | | |
|---|---|---|---|
| 55-127030 | 10/1980 | Japan | H01L 21/58 |
| 56-87331 | 7/1981 | Japan | H01L 21/58 |
| 3-45539 | 7/1991 | Japan | H01L 21/60 |
| 3-39227 | 6/1992 | Japan | H01L 21/50 |

*Primary Examiner*—Henry A. Bennett
*Assistant Examiner*—Gregory A. Wilson
*Attorney, Agent, or Firm*—Koda and Androlia

[57] ABSTRACT

A baking oven for heating lead frames used in the manufacturing of semiconductor devices including an oven main body having an entrance and an exit for lead frames, a heating device which creates a high-temperature atmosphere inside the oven main body, a lead frame magazine installed inside the oven main body so as to accommodate lead frames in a stacked fashion, a magazine mover which moves the lead frame magazine in a vertical direction, and a width adjustment device that changes the width of the lead frame magazine in a horizontal direction. The magazine mover and the width adjustment device are provided outside the oven main body for securing a high lead frame accommodation capacity and a longer heating time of the oven.

8 Claims, 6 Drawing Sheets

LEAD FRAME BAKING OVEN

BACKGROUND OF THE INVENTION

1. Field of the Invention

The present invention relates to a lead frame baking oven which is used for the pre-baking (preparatory heating) of insulating tapes applied to lead frames or for the baking (heating) of adhesive agents (resin pastes) applied to lead frames in order to secure semiconductor chips to the lead frames.

2. Prior Art

Figure 10A:
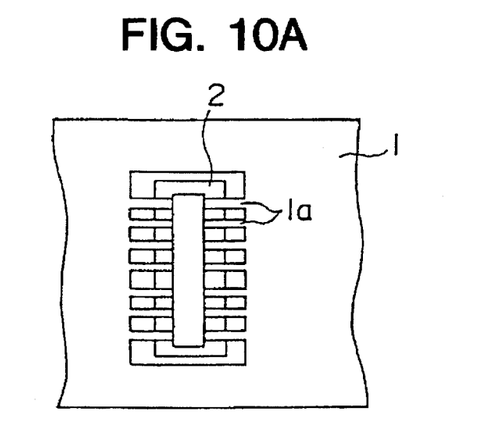
Figure 10B:
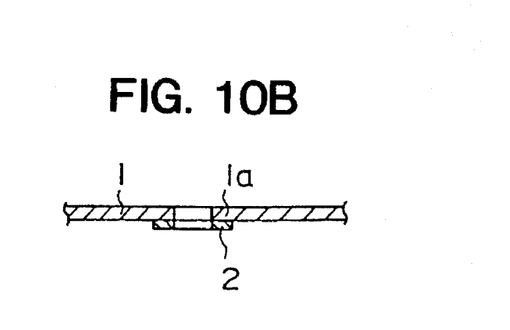
Figure 11A:
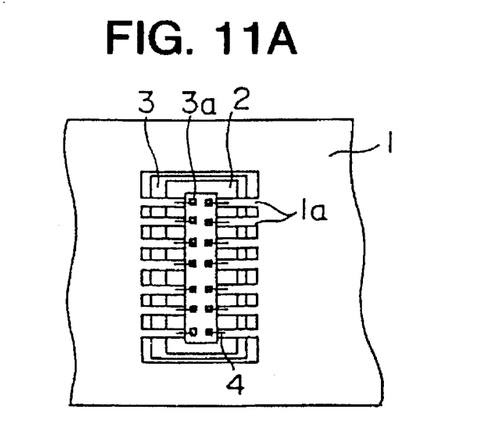
Figure 11B:
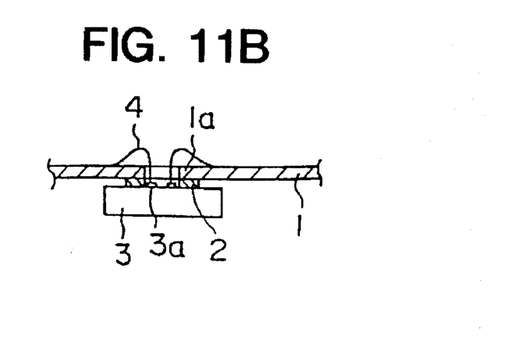
Figure 12A:
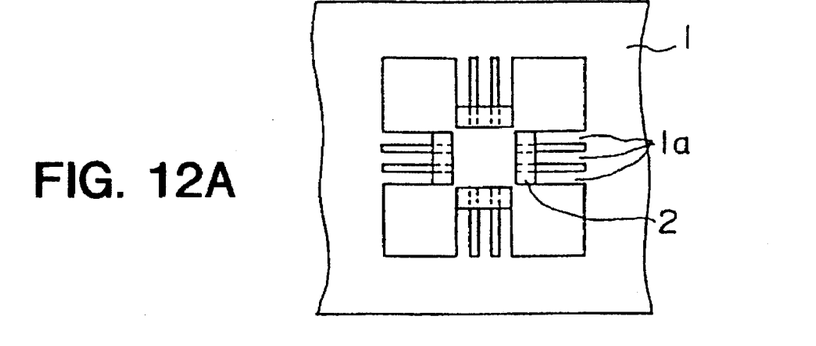
Figure 12B:
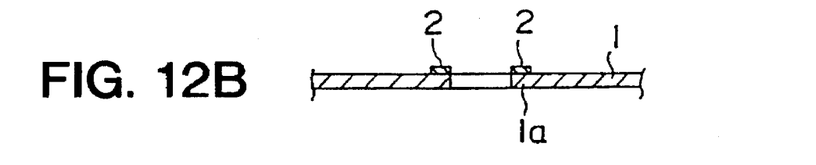
Figure 13A:
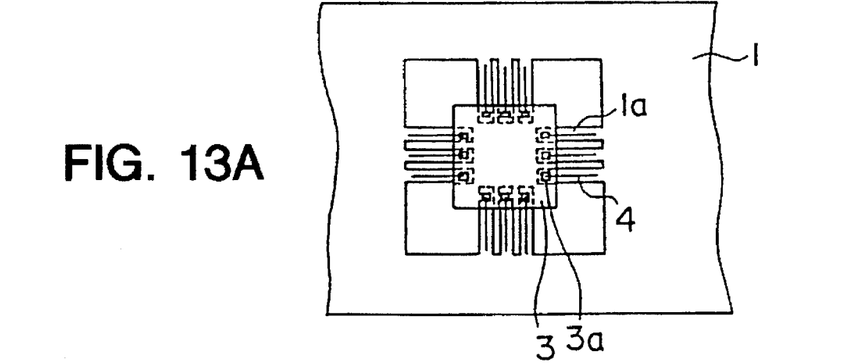
Figure 13B:
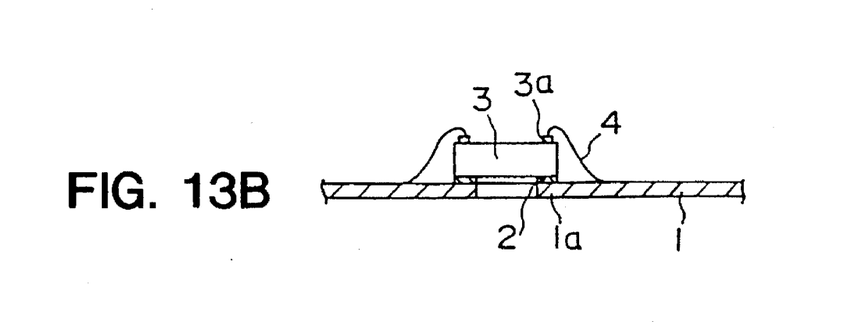

Semiconductor devices are manufactured, for example, in the following manner: As shown in FIGS. 10 and 12, an insulating tape 2 coated with an adhesive agent is applied in advance to the under surface (FIG. 10(b)) or upper surface (FIG. 12(b)) of the leads 1a of a lead frame 1, and the lead frame 1 is pre-baked in baking ovens so as to remove moisture from the insulating tape 2. Then, as shown in FIGS. 11 and 13, a semiconductor chip 3 is chip-bonded to the under surface (FIG. 11(b)) or upper surface (FIG. 13(b)) of the insulating tape 2, and afterward the electrodes 3a of the semiconductor chip 3 and the leads 1a of the lead frame 1 are connected via wires 4.

As well known to artisans skilled in the art, there are other type of devices. In this case, the die carrying part of a lead frame is coated with an adhesive agent, a semiconductor chip is pressed against the adhesive agent so that the chip is secured to the lead frame (called "chip bonding"), and then the adhesive agent is baked in baking ovens so that the electrodes of the semiconductor chip are afterwards connected to the leads of the lead frame via wires (called "wire bonding").

Conventional baking ovens used for pre-baking the insulating tapes or for baking the adhesive agent as described above have a straight tunnel type structure. In these types of ovens, a feeder for conveying the lead frames is surrounded by a heat insulating material, and heaters for heating the objects are installed in series beneath the lead frame conveying path, and a cooling device for cooling the lead frames is installed above the conveying path.

Baking ovens of this type are described in, for example, Japanese Patent Application Laid-Open (Kokai) Nos. 55-127025, 55-127030 and 56-87331 and in Japanese Patent Application Publication (Kokoku) No. 3-45539. In particular, the Japanese Patent Application Laid-Open (Kokai) No. 55-127025 relates to a tunnel type oven that supplies into the tunnel with inert gas which is lower in the temperature than the eutectic temperature of solder, the Japanese Patent Application Laid-Open (Kokai) No. 55-127030 relates to an oven provided with a heater inside that is movable horizontally and vertically, the Japanese Patent Application Laid-Open (Kokai) No. 56-87331 relates to an oven with sealing plates that are opened by transferred workpieces and prevent supplied gas from escaping, and the Japanese Patent Application Publication (Kokoku) No. 3-45539 relates to an oven provided with a reducing gas supply and a reducing heater.

In the prior art described above, the straight-line structure oven generally has a small lead frame accommodating capacity. As a result, the pre-baking or baking time is short, and the removal of moisture from the insulating tape or the baking of the adhesive agent is not accomplished unless the temperature of the heater is set high. If, however, the pre-baking or baking temperature is set high, there is a danger that the oven's function halts which results in thermal destruction (or deterioration) of the insulating tape, and there is a danger that such a halt of the oven will lead to thermal destruction of the semiconductor chip. In order to prevent the thermal destruction of the insulating tape or semiconductor chip, the insulating tape or semiconductor chit is protected during the halt of the oven by the cooling device (which effects a cooling blast) by lowering the temperature. However, once the temperature has been lowered, considerable time is required to bring the temperature back to the original set value.

In the meantime, the Japanese Patent Application Publication (Kokoku) No. 4-39227 discloses an apparatus that allows automatic adjustment of the width of the guide rails that guide the lead frames so that the guide rails can comply with changes in the width of the lead frames that occurs when the type of the product to be handled is changed. However, it is difficult to use this guide rail width adjustment means in the conventional baking oven described above. In other words, ovens that can heat any type of lead frames (which differ in size in particular) has not yet been practically used.

SUMMARY OF THE INVENTION

Accordingly, it is a first object of the present invention to provide a lead frame baking oven which has a high lead frame accommodation capacity so that a long pre-baking or baking time can be set.

It is a second object of the present invention to provide a lead frame baking oven which makes it possible to reduce the overall size of the oven main body.

The third object of the present invention is to provide a lead frame baking oven which can comply with changes in the width of the lead frames to be processed.

The first means of the present invention for accomplishing the first object is characterized in that the oven includes: an oven main body which has entrance and exit openings for lead frames on a lead frame conveying path, a heating means which creates a high-temperature atmosphere inside the oven main body, a lead frame magazine (merely called "magazine") installed inside the oven main body so as to accommodate therein lead frames in a stacked fashion with a predetermined space between the lead frames, and a magazine raising and lowering means which moves the magazine vertically.

The second means of the present invention for accomplishing the second object is characterized in that the oven includes: an oven main body which has entrance and exit openings for lead frames on a lead frame conveying path, a heating means which creates a high-temperature atmosphere inside the oven main body, a magazine installed inside the oven main body so as to accommodate therein lead frames in a stacked fashion at a predetermined space between the lead frames, a magazine raising and lowering means which moves the magazine vertically, and a magazine width adjustment means which changes the width of the magazine.

The third means of the present invention for accomplishing the first and second objects is characterized in that in the first and second means describe above, the magazine raising and lowering means is provided outside the oven main body.

The fourth means of the present invention for accomplishing the first and second objects is characterized in that in the second means described above, the magazine width adjustment means is provided outside the oven main body.

The fifth means of the present invention for accomplishing the first through third objects is characterized in that in the second means described above: the magazine width adjustment means is provided outside the oven main body so that the width adjustment means effects horizontal movement of the magazine shafts which are respectively fastened to two stocker plates that make up the magazine, and the magazine raising and lowering means is provided outside the oven main body so as to raise and lower the magazine width adjustment means.

In the oven according to the present invention, the magazine is installed inside the oven main body. Accordingly, the lead frame accommodating capacity of the oven is high. Furthermore, the lead frames accommodated in the magazine can be successively discharged into the next process, and the lead frames can be kept in the magazine for a considerable period of time before being discharged into the next process. Accordingly, it is possible to set a long pre-baking or baking time. As a result, low-temperature moisture removal can be executed, and thermal destruction of the insulating tape or semiconductor chip is prevented. In addition, the oven structure is simple, since there is no need to use a cooling system.

In addition, the magazine raising and lowering means and the magazine width adjustment means of the present invention are provided outside the oven main body. Accordingly, the size of the oven main body can be reduced, and a heating atmosphere can be created efficiently inside the oven main body.

Furthermore, the magazine raising and lowering means and the magazine width adjustment means are provided outside the oven main body; and in addition, the magazine shafts fastened to the stocker plates of the magazine are moved horizontally by the magazine width adjustment means, and the magazine width adjustment means is raised and lowered by the magazine raising and lowering means. Accordingly, the width of the magazine for accommodating the lead frames in the baking oven can easily be adjusted so that lead frames of any size can be heated in the oven.

BRIEF DESCRIPTION OF THE DRAWINGS

FIG. 10 illustrates one example of a lead frame to which an insulating tape is bonded, wherein FIG. 10(a) is a top view, and FIG. 10(b) is a cross sectional view;

FIG. 11 illustrates a semiconductor device with a semiconductor chip chip-bonded and wires wire-bonded to the lead frame shown in FIG. 10, wherein FIG. 11(a) is a top view, and FIG. 11(b) is a cross sectional view;

FIG. 12 shows another example of a lead frame to which an insulating tape is bonded, wherein FIG. 12(a) is a top view, and FIG. 12(b) is a cross sectional view; and FIG. 13 illustrates a semiconductor device in which a semiconductor chip is chip-bonded and wires are wire-bonded to the lead frame shown in FIG. 12, wherein FIG. 13(a) is a top view, and FIG. 13(b) is a cross sectional view.

DETAILED DESCRIPTION OF THE INVENTION

One embodiment of the present invention will be described below with reference to FIGS. 1 through 10.

Figure 1:
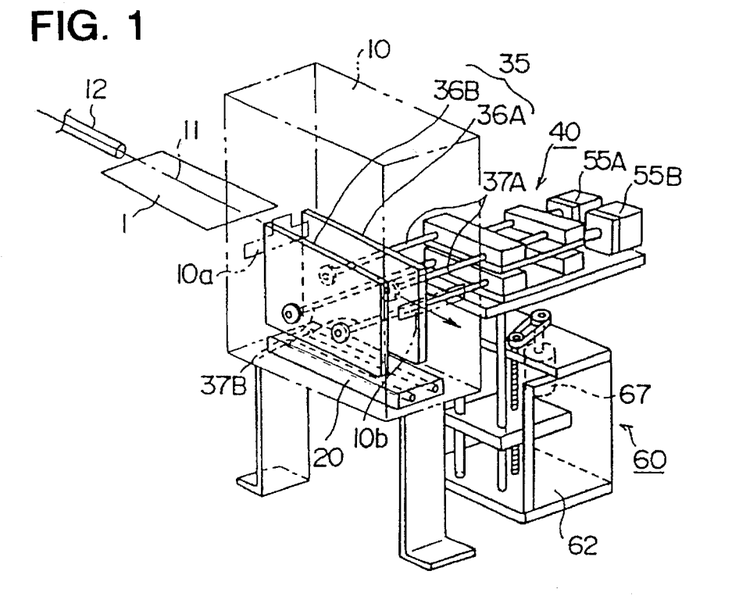
FIG. 1 is a perspective view of one embodiment of the baking oven according to the present invention.

As shown in FIG. 1, the baking oven of the present invention includes an oven main body 10, a heating means 20 which creates a high-temperature atmosphere inside the oven main body 10, a magazine 35 which accommodates therein lead frames 1 with the lead frames being stacked with a predetermined space between them, a magazine width adjustment means 40 which adjusts the width of the magazine 35, and a magazine raising and lowering means 60 which moves the magazine 35 in a vertical direction.

Figure 2:
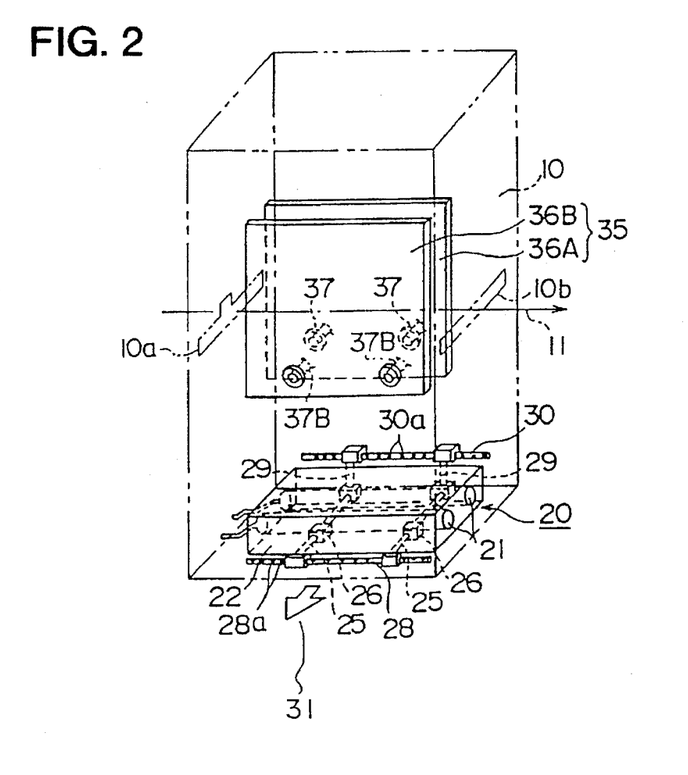
FIG. 2 is a perspective view of the interior of the oven main body of FIG. 1.
Figure 3:
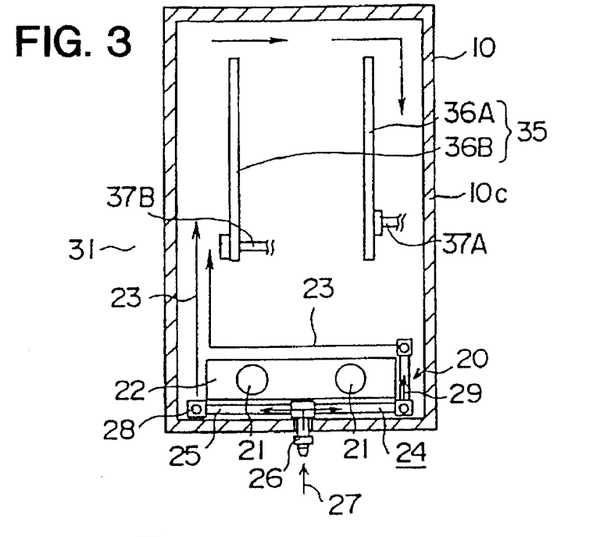
FIG. 3 is a cross sectional view of the interior of the oven main body.

As shown in FIGS. 1 through 3, the oven main body 10 is a three-dimensional box, and the outer walls are covered with a heat insulating material, such as adiabatic material, for instance. An entrance opening 10a through which each lead frame 1 and a pusher 12 for pushing the lead frames 1 advance into the main body 10 is formed on the entry side of a lead frame conveying path 11. An exit opening 10b from which the lead frames 1 are discharged is formed on the exit side of the conveying path 11 of the oven main body 10.

Figure 7:
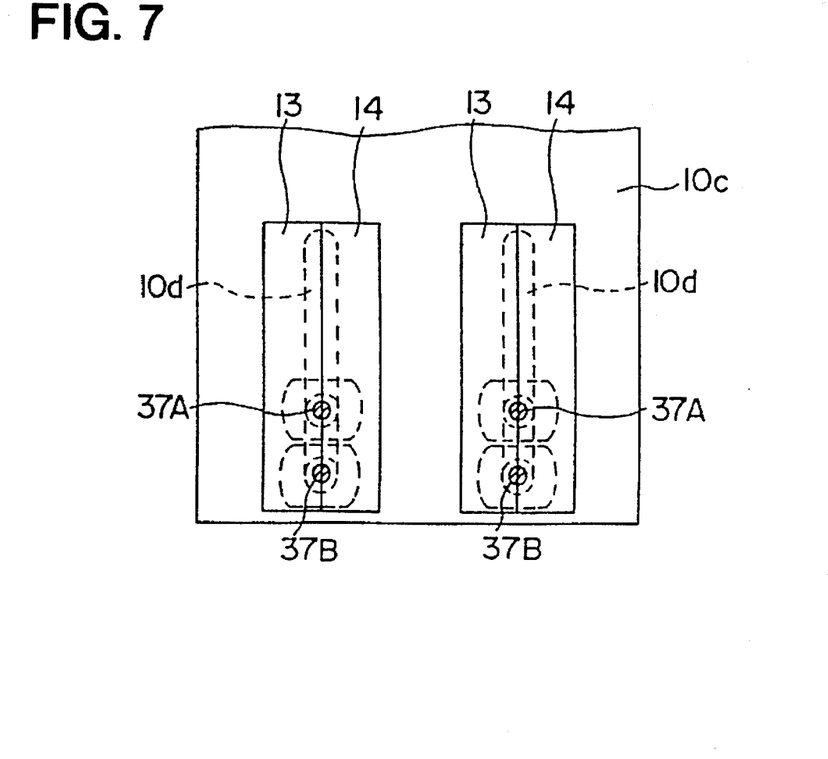
FIG. 7 is a rear view of the oven main body.

As seen from FIG. 7, two slots 10d are formed vertically in one side plate 10c of the oven main body 10 which is perpendicular to the conveying path 31 so that two pairs of magazine shafts 37A and 37B which support the magazine 35 (to be described later) can move up and down. Flexible elastic plates 13 and 14 made of, for example, rubber plates are attached to the side plate 10c so that the elastic plates 13 and 14 close off the slots 10d from both (right and left in FIG. 4) sides.

FIGS. 2 and 3 illustrate the heating means 20.

The heating means 20 comprises a heating block 22 and a gas blowing assembly 24 which is connected to a gas supply or a gas source (not shown). The heating block 22 is installed on the bottom surface of the oven main body 10 and has two cartridge heaters 21 inside. The gas blowing assembly 24 blows a heated gas 23 into the oven main body 10 as a convection current. The gas blowing assembly 24 includes two delivery pipes 25 provided beneath the heating block 22. Couplings 26 are connected to the delivery pipes 25, and a gas 27 such as dry air or nitrogen, etc. is supplied to the couplings 26 from the outside. A front convection pipe 28 is connected to the front or operator side 31 of the delivery pipes 25, and numerous blowing holes 28a opened upwardly are formed in the front convection pipe 28. Furthermore, a rear convection pipe 30 is connected to the rear ends of the delivery pipes 25 via vertical connecting pipes 29, and numerous blowing holes 30a which face the upper surface of the heating block 22 are formed in the rear convection pipe 30.

Figure 4:
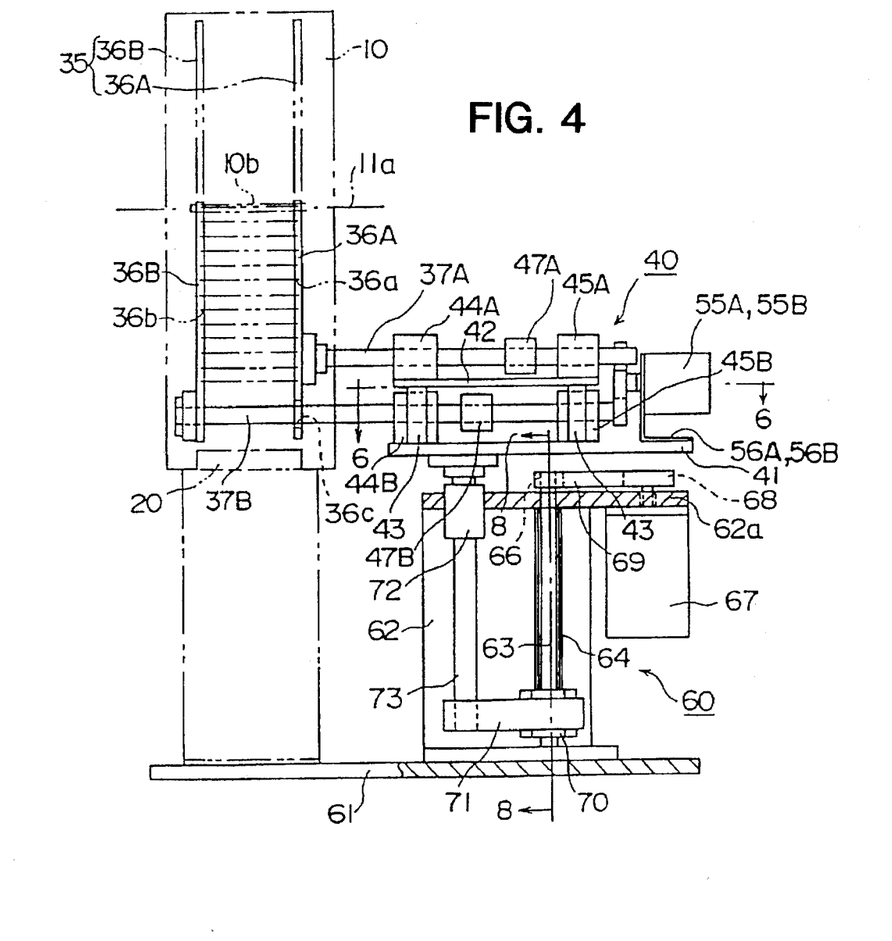
FIG. 4 is a right-side view of the oven shown in FIG. 1.
Figure 5:
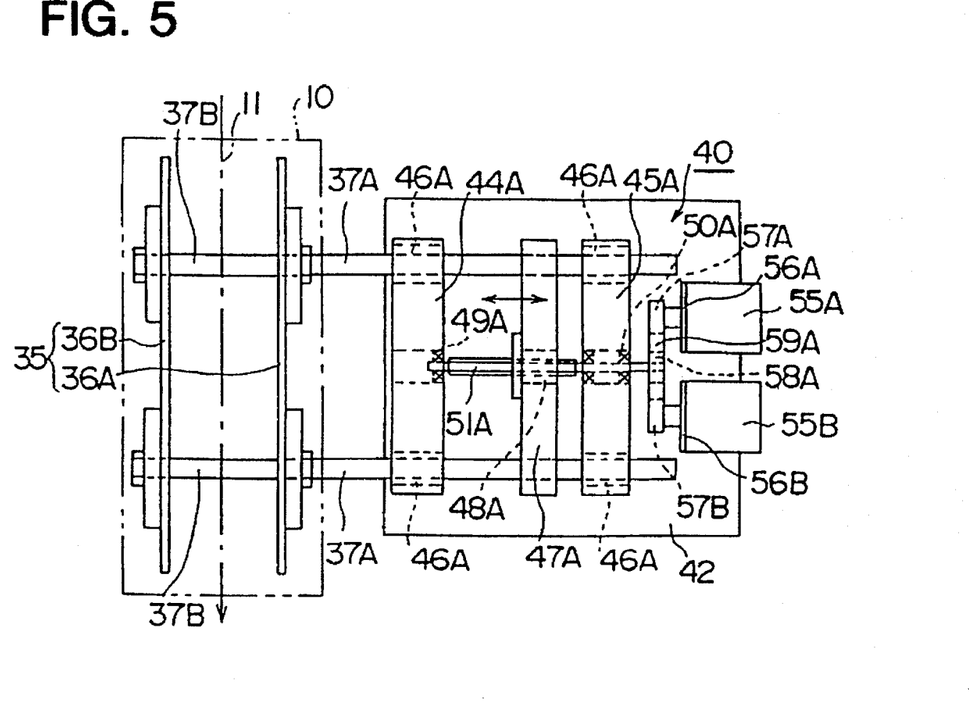
FIG. 5 is a top view thereof.

As shown in FIG. 4, the magazine 35 is installed above the heating means 20 inside the oven main body 10 and includes a pair of stocker plates 36A and 36B. The stocker plates 36A and 36B are vertically installed so as to face each other and are parallel to the conveying path 11. A multiple number of grooves 36a and 36b which hold both ends of each one of the lead frames 1 in a stacked fashion with a predetermined space between the lead frames as seen in FIG. 4 are formed on the inner surfaces of the stocker plates 36A and 36B. The stocker plates 36A and 36B are supported by two pairs of upper and lower magazine shafts 37A and 37B as best seen in FIG. 5 which are installed horizontally and parallel to each other. The magazine shafts 37A and 37B extend in a direction of right angles relative to the lead frame conveying path 11. End portions of these magazine shafts 37A and 37B are brought into the oven main body 10 through the slots 10d (see FIG. 7) of the oven main body 10. The lower magazine shafts 37B pass through holes 36c formed in the stocker plate 36A.

Figure 6:
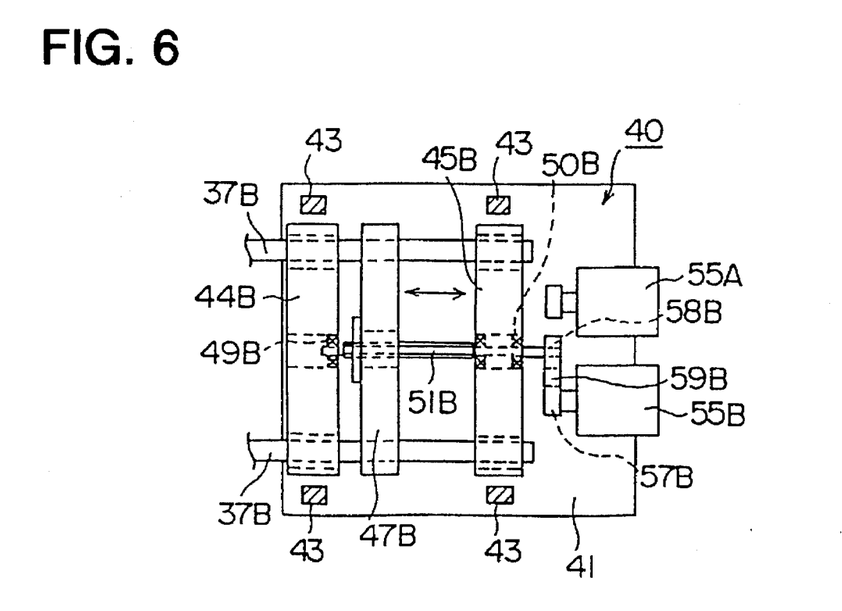
FIG. 6 is a cross section taken along the line 6—6 in FIG. 4.

The magazine width adjustment means 40 is best illustrated in FIGS. 4 through 6. The magazine width adjustment means 40 includes a raising and lowering plate 41 which is located beneath the lower magazine shafts 37B, and a supporting plate 42 which is located between the upper magazine shafts 37A and the lower magazine shafts 37B. The supporting plate 42 is above the raising and lowering plate 41 by four supporting columns 43.

Two upper guide blocks 44A and 45A are provided on the upper surface of the supporting plate 42. The pairs of upper magazine shafts 37A are passed through these upper guide blocks 44A and 45A via linear bushes 46A interposed between the shafts 37A and the blocks 44A and 45A so that the upper magazine shafts 37A are slidable in the guide blocks 44A and 45A. A movable plate 47A is fastened at its both ends to the upper magazine shafts 37A and positioned between the two upper guide blocks 44A and 45A. A horizontal cylinder 48A having internal thread is provided at the center of the movable plate 47A, and a horizontal screw 51A having external thread engages with the horizontal cylinder 48A. The horizontal screw 51A is supported by the two upper guide blocks 44A and 45A via bearings 49A and 50A so that the horizontal screw is rotatable.

Two lower guide blocks 44B and 45B are, like the upper guide blocks 44A and 45A, provided on the upper surface of the raising and lowering plate 41, and the pair of lower magazine shafts 37B are passed through these lower guide blocks 44B and 45B via linear bushes 46B interposed between the shafts 37B and the blocks 44B and 45B so that the lower magazine shafts 37B are slidable in the guide blocks 44B and 45B. A movable plate 47B is at its both ends attached to the pair of magazine shafts 37B and positioned between the two lower guide blocks 44B and 45B. A horizontal cylinder 48B having an internal thread is provided at the center of the movable plate 47B, and a horizontal screw 51B having an external thread engages with the two lower guide blocks 44B and 45B via bearings 49B and 50B so that the horizontal screw 51B is rotatable.

Width adjustment motors 55A and 55B are mounted on the upper surface of the raising and lowering plate 41 via brackets 56A and 56B, respectively. A timing pulley 57A is attached to the output shaft of the width adjustment motor 55A, and another timing pulley 57B is attached to the output shaft of the width adjustment motor 55B. A timing pulley 58A is attached to the end of the upper horizontal screw 51A at the position facing the timing pulley 57A, and another timing pulley 58B is attached to the end of the lower horizontal screw 51B so as to face the timing pulley 57B. A timing belt 59A is mounted between the timing pulleys 57A and 58A, and another timing belt 59B is mounted between the timing pulleys 57B and 58B.

Figure 8:
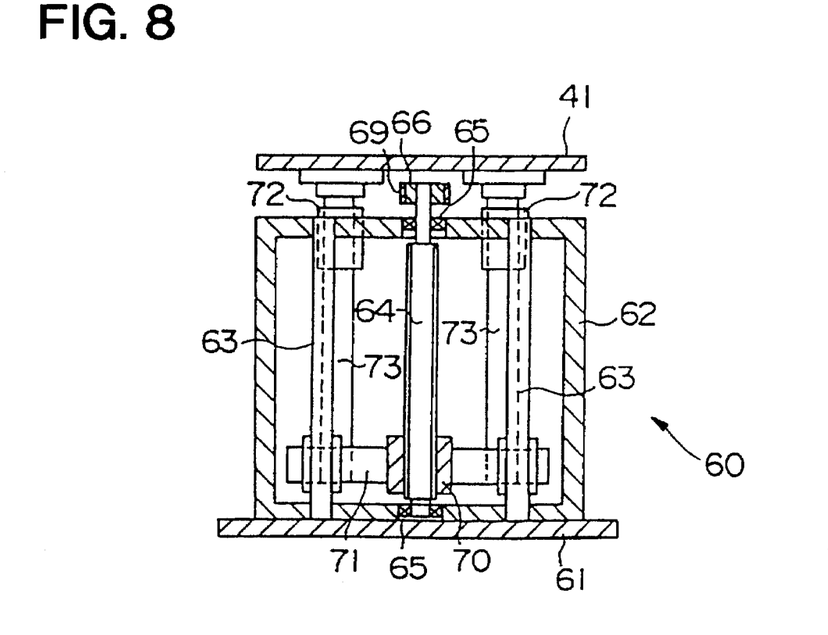
FIG. 8 is a cross section taken along the line 8—8 in FIG. 4.

The magazine raising and lowering means 60 is best shown in FIGS. 4 and 8, and it is installed beneath the raising and lowering plate 41.

More specifically, a frame 62 of the magazine raising and lowering means 60 is mounted to the upper surface of a base plate 61, and two guide rods 63 are vertically installed in the frame 62. The upper and lower ends of the guide rods 63 are secured to the frame 62. A vertical screw shaft 64 having an internal thread is installed between the two guide rods 63 so that the vertical screw shaft 64 is parallel to the guide rods 63. The vertical screw shaft 64 is supported in the frame 62 via upper and lower bearings 65 in a rotatable fashion. A timing pulley 66 is attached to the upper end of the vertical screw shaft 64. As seen in FIG. 4, a raising and lowering drive motor 67 that has a timing pulley 68 fastened to its output shaft is secured to the under surface of the upper plate 62a of the frame 62, and a timing belt 69 is mounted between the timing pulley 66 of the vertical screw shaft 64 and the timing pulley 68 of the motor 67. A movable cylinder 70 having an internal thread, as best shown in FIG. 8, engages with the vertical screw shaft 64, and a wing plate 71 is attached to this movable cylinder 70. Two pushing rods 73 are passed through the upper plate 62a of the frame 62 via bearings 72 so that the pushing rods 73 can move up and down, and the bottom ends of the pushing rods 73 are connected to the wing plate 71, and the upper ends of the pushing rods 73 are connected to the raising and lowering plate 41.

Figure 9:
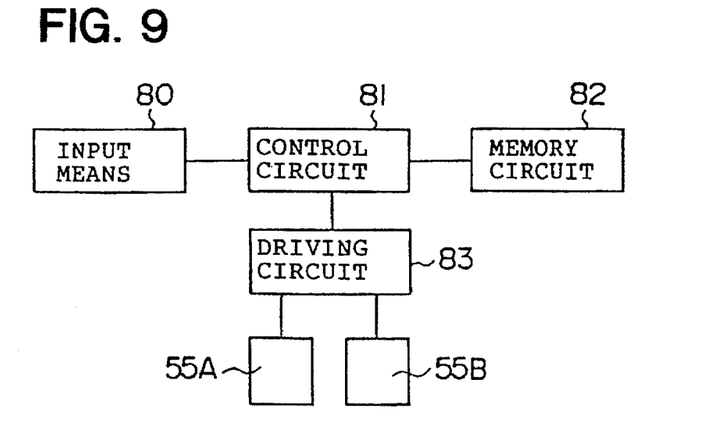
FIG. 9 is a block diagram of the magazine width adjustment circuit.

FIG. 9 shows the width adjustment circuit for the magazine 35 which comprises the pair of stocker plates 36A and 36B facing each other. The width of lead frames varies depending upon the type of the lead frame. Thus, a particular width value of lead frames to be processed is stored beforehand in a memory circuit 82 by an input means 80 via a control circuit 81 so that the space of the stocker plates 36A and 36B matches the width size of the particular type of lead frame to be processed. The control circuit 81 actuates the width adjustment motors 55A and 55B via a driving circuit 83.

The thus described oven operates in the following manner:

First, a high-temperature atmosphere is created inside the oven main body 10. More specifically, the cartridge heaters 21 of the heating block 22 are turned on, and as shown in FIG. 3, the gas 27 is supplied via the couplings 26. The gas 27 supplied via the couplings 26 is fed to the front convection pipe 28 via the delivery pipes 25 and to the rear convection pipe 30 via the delivery pipes 25 and connecting pipes 29. As a result, the gas is blown out of the blowing holes 28a of the front convection pipe 28 and also out of the blowing holes 30a of the rear convection pipe 30. Thus, the heated gas 23, as seen in FIG. 3, being subjected to forced convection inside the oven main body 10 is generated, and a uniform heating atmosphere is created in the oven main body 10.

In the following description, it is assumed that the width of the magazine 35 (or the space between the stocker plates 36A and 36B) matches the width of a lead frames to be accommodated.

First, the lead frames 1 are fed into the magazine 35. FIG. 4 shows the magazine 35 at its lowest position and being empty. The magazine 35 is, from this position, raised as indicated by the two-dot chain line by the magazine raising and lowering means 60 so that the grooves 36a and 36b of the first (or the lowest) stage of the stocker plates 36A and 36B are positioned at the conveying path level 11a. Then, the accommodation of lead frames into the magazine 35 starts. In other words, when the first lead frame 1 (to which an insulating tape 2 has been bonded) is conveyed to the entrance opening 10a of the oven main body 10, the pusher 12 is actuated so as to make a reciprocating movement so that the first lead frame is pushed into the grooves 36a and 36b of the first stage of the magazine 35.

Next, the raising and lowering drive motor 67 is actuated so that the grooves 36a and 36b of the second stage (i.e., second stage from bottom) of the magazine 35 are positioned at the level of the conveying path 11. More specifically, when the raising and lowering drive motor 67 is driven, the vertical screw shaft 64 is rotated via the timing pulley 68, timing belt 69 and timing pulley 66 so that the movable cylinder 70 along with wing plate 71 are lowered by the rotating vertical screw shaft 64. Since the raising and lowering plate 41 is connected to the wing plate 71 via the pushing rods 73, and since the magazine shafts 37A and 37B are provided on the raising and lowering plate 41, the magazine 35 is lowered when the wing plate 71 is lowered.

When the grooves 36a and 36b of the second stage of the magazine 35 are positioned at the conveying path level 11a, and the next or second lead frame is conveyed to the entrance opening 10a of the magazine 35, the pusher 12 again makes a reciprocating movement, pushing the second lead frame into the grooves 36a and 36b of the second stage of the magazine 35. Lead frames are thus accommodated in all of the grooves 36a and 36b up to the uppermost stage of the magazine 35 by repeating the above-described operation.

When the lead frames 1 are thus being fed into the magazine 35, the lead frames 1 and the insulating tapes 2 bonded to the lead frames 1 are dehumidified (pre-baked), starting with the first-stage (or the bottom) lead frame 1 inside the magazine 35 by the heating atmosphere created inside the oven main body 10. When the transfer of the lead frames 1 into the magazine 35 is completed, the raising and lowering drive motor 67 is rotated in the opposite direction so as to raise the magazine 35 until the grooves 36a and 36b of the first stage of the magazine 35 are positioned at the conveying path level 11a.

Next, the pusher 12 reciprocates so that the first-stage lead frame 1 in the magazine 35 is pushed out through the exit opening 10b into the feeder section of a chip bonding machine (not shown) which performs the next process to the pushed out lead frame 1. Afterward, a new lead frame 1 is fed to the entrance opening 10a of the magazine 35, and then the pusher 12 pushes the new lead frame 1 into the empty grooves 36a and 36b of the magazine 35. After this, the raising and lowering drive motor 67 is rotated so that the grooves 36a and 36b of the second stage of the magazine 35 are positioned at the conveying path level 11a. Then, when there is a demand of a lead frame from the next process, the second-stage lead frame 1 is pushed out to the feeder section as described above, and a new lead frame is pushed into the grooves 36a and 36b of the second stage. Afterward, the grooves 36a and 36b of the third stage are positioned at the conveying path level 11a. Subsequently, the operation described above is repeated.

The lead frames which have been pushed out from the oven main body 10 to the feeder section are forwarded to the bonding section of a chip bonding machine by the feeder section as in conventional methods, and the semiconductor chips 3 are subjected to chip bonding to the lead frames and then stored in a storage magazine (not shown).

When the type, and therefore the size, of the lead frame to be processed is changed, the width of the magazine 35 is adjusted. As seen from FIG. 5, the width adjustment motor 55A is actuated, and the horizontal screw 51A is rotated via the timing pulley 58A, timing belt 59A and timing pulley 57A. As a result, the horizontal cylinder 48A and movable plate 47A are moved in the direction indicated by the arrow. Since the pair of upper magazine shafts 37A are attached to the movable plate 47A, and the stocker plate 36A is secured to the upper magazine shafts 37A, the stocker plate 36A is moved in the same direction. Likewise, as shown in FIG. 6, when the width adjustment motor 55B is actuated, the horizontal screw 51B is rotated via the timing pulley 58B, timing belt 59B and timing pulley 57B, so that the horizontal cylinder 48B, movable plate 47B, lower magazine shafts 37B and stocker plate 36B are moved in the direction indicated by the arrow.

In this way, the space between the stocker plates 36A and 36B (or the width of the magazine 35) is changed.

The width adjustment motors 55A and 55B are driven so as to move the stocker plates 36A and 36B by equal amounts in the opposite directions; thus the center line between the stocker plates 36A and 36B is prevented from shifting.

As seen from FIG. 9, when information of the lead frame to be processed is inputted into the input means 80, the control circuit 81 reads out the corresponding type data stored beforehand in the memory circuit 82 and drives the width adjustment motors 55A and 55B via the driving circuit 83 so that the width of the magazine 35 is automatically adjusted to the lead frame to be processed.

In the above embodiment, the lead frames 1 with bonded insulating tapes are processed. The present invention of course is applicable to lead frames applied with an adhesive agent, so that the adhesive agent is baked after it is chip bonded to the semiconductor chips 3.

As seen from the above, according to the present invention, the lead frame accommodating capacity can be high, and it is possible to set a long pre-baking or baking time. In addition, the size of the oven main body can be reduced. Furthermore, the baking oven can meet changes in the width of lead frames to be processed.

I claim:

1. A lead frame baking oven characterized in that said oven comprising:

an oven main body provided with an entrance opening and exit opening for lead frames on a lead frame conveying path;

a heating means for creating a high-temperature atmosphere inside said oven main body;

a lead frame magazine installed inside said oven main body so as to accommodate therein lead frames with said lead frames being stacked at a predetermined space;

a magazine raising and lowering means for raising and lowering said lead frame magazine; and a magazine width adjustment means for changing a width of said lead frame magazine.

2. A lead frame baking oven according to claim 1 characterized in that said heating means comprises:

a heating block which is installed inside said oven main body, and a gas blowing means which causes heat of said heating block to flow in a convection current inside said oven main body.

3. A lead frame baking oven according to claim 1 characterized in that said magazine raising and lowering means is provided outside said oven main body.

4. A lead frame baking oven according to claim 1 characterized in that said magazine width adjustment means is provided outside said oven main body.

5. A lead frame baking oven characterized in that said oven comprises:

an oven main body provided with an entrance opening and exit opening for lead flames on a lead frame conveying path;

a heating means for creating a high-temperature atmosphere inside said main body;

a lead frame magazine installed inside said oven main body so as to accommodate therein lead frames with said lead frames being stacked at a predetermined space;

a magazine raising and lowering means for raising and lowering said lead frame magazine; and a magazine width adjustment means for changing a width of said lead frame magazine; and wherein:

said lead frame magazine comprises a pair of stocker plates, and said magazine width adjustment means is provided outside said oven main body so that said width adjustment means effects a horizontal movement of magazine shafts which are connected to said stocker plates; and said magazine raising and lowering means is provided outside said oven main body and raises and lowers said magazine width adjustment means.

6. A lead frame baking oven comprising:

an oven main body provided with entrance and exit openings for lead frames, said openings being provided in opposite sides walls of said oven main body and on a lead frame conveying path;

a heating means installed in said oven main body for creating a high-temperature atmosphere inside said oven main body;

a lead frame magazine installed inside said oven main body and above said heating means for accommodating therein lead frames, said lead frame magazine comprising a pair of stocker plates for spacedly piling up said lead frames between said pair of stocker plates;

a magazine raising and lowering means provided outside of said oven main body for moving said lead frame magazine in a vertical direction; and a magazine width adjustment means provided on said magazine raising and lowering means for moving said pair of stocker plates horizontally and in a right angle direction relative to said lead frame conveying path for changing a space between said pair of stocker plates.

7. A lead frame baking oven according to claim 6, wherein said heating means comprising:

a heating block provided wherein with heating elements; and a gas blowing means provided outside of said heating block, said gas blowing means making heat from said heating block to flow as a convection current inside said oven main body.

8. A lead frame baking oven according to claim 6, wherein said magazine width adjustment means comprising:

a pair of upper magazine shafts, one end of said pair of upper magazine shafts being attached to one of said stocker plates of said lead frame magazine;

a pair of lower magazine shafts, one end of said pair of lower magazine shafts being attached to other one of said stocker plates of said lead frame magazine; and a plurality of rotational power sources each connected to said upper pair of magazine shafts and to said lower pair of magazine shafts via power transfer means so as to effect horizontal movements of said upper and lower magazine shafts.

* * * * *